United States Patent
Lay et al.

(10) Patent No.: US 9,605,345 B2
(45) Date of Patent: Mar. 28, 2017

(54) VERTICAL FURNACE FOR IMPROVING WAFER UNIFORMITY

(71) Applicant: Taiwan Semiconductor Manufacturing Co., Ltd., Hsinchu (TW)

(72) Inventors: Eddy Lay, Hsinchu (TW); Shih-Min Tseng, Zhubei (TW); Sheng-Wei Wu, Zhubei (TW); Jen-Chung Chen, Hsinchu (TW); Shih-Fang Chen, Zhubei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 559 days.

(21) Appl. No.: 13/974,366

(22) Filed: Aug. 23, 2013

(65) Prior Publication Data
US 2015/0053136 A1  Feb. 26, 2015

(51) Int. Cl.
*C23C 16/46* (2006.01)
*C23C 16/44* (2006.01)
*C23C 16/455* (2006.01)

(52) U.S. Cl.
CPC .......... *C23C 16/46* (2013.01); *C23C 16/4401* (2013.01); *C23C 16/455* (2013.01)

(58) Field of Classification Search
CPC .... C23C 16/46; C23C 16/4401; C23C 16/455
USPC ............... 118/718, 719; 156/345.31–345.32
See application file for complete search history.

(56) References Cited

U.S. PATENT DOCUMENTS

| | | | | | |
|---|---|---|---|---|---|
| 3,783,822 | A | * | 1/1974 | Wollam | C23C 16/4584 118/725 |
| 4,823,734 | A | * | 4/1989 | Christin | C23C 16/00 118/715 |
| 5,048,800 | A | * | 9/1991 | Miyazaki | C23C 16/54 266/251 |
| 5,370,371 | A | * | 12/1994 | Miyagi | C23C 16/4583 118/724 |
| 5,480,678 | A | * | 1/1996 | Rudolph | C04B 35/83 118/715 |
| 5,853,485 | A | * | 12/1998 | Rudolph | C04B 35/83 118/715 |
| 5,902,103 | A | * | 5/1999 | Maeda | C23C 16/455 432/152 |
| 5,938,852 | A | * | 8/1999 | Nam | C23C 16/4401 118/724 |
| 6,001,182 | A | * | 12/1999 | Page | H01L 21/67754 118/715 |
| 6,716,027 | B2 | * | 4/2004 | Kim | C30B 31/14 118/728 |
| 6,780,462 | B2 | * | 8/2004 | Purdy | C04B 35/83 427/248.1 |

(Continued)

*Primary Examiner* — Rudy Zervigon
(74) *Attorney, Agent, or Firm* — Maschoff Brennan

(57) ABSTRACT

A vertical furnace includes a heat treatment tube, at least one reactive gas inlet, first adiabatic plates and second adiabatic plates. The at least one reactive gas inlet is disposed at or near a bottom end of the heat treatment tube. The first adiabatic plates are stacked in the heat treatment tube, each of the first adiabatic plates having a flow channel structure for allowing a gas to pass through, in which all the corners in the flow channel structure are rounded. The second adiabatic plates are stacked below the first adiabatic plates in the heat treatment tube.

18 Claims, 7 Drawing Sheets

(56) References Cited

U.S. PATENT DOCUMENTS

| | | | | |
|---|---|---|---|---|
| 6,879,778 B2* | 4/2005 | Yoo | ............... | C23C 16/46 |
| | | | | 118/50.1 |
| 7,476,419 B2* | 1/2009 | Rudolph | ............... | C23C 16/045 |
| | | | | 177/245 |
| 7,892,646 B1* | 2/2011 | Rudolph | ............... | C23C 16/045 |
| | | | | 428/408 |
| 2002/0076491 A1* | 6/2002 | Delperier | ............... | C04B 35/83 |
| | | | | 427/248.1 |
| 2003/0049372 A1* | 3/2003 | Cook | ............... | C23C 16/24 |
| | | | | 427/248.1 |
| 2005/0098107 A1* | 5/2005 | Du Bois | ............... | C23C 16/45578 |
| | | | | 118/715 |
| 2005/0121145 A1* | 6/2005 | Du Bois | ............... | C23C 16/45578 |
| | | | | 156/345.33 |
| 2007/0137794 A1* | 6/2007 | Qiu | ............... | C23C 16/45504 |
| | | | | 156/345.33 |
| 2007/0243317 A1* | 10/2007 | Du Bois | ............... | C23C 16/4583 |
| | | | | 427/98.9 |
| 2010/0186667 A1* | 7/2010 | Ishii | ............... | C23C 16/45578 |
| | | | | 118/712 |
| 2010/0218724 A1* | 9/2010 | Okada | ............... | C23C 16/4405 |
| | | | | 118/724 |
| 2011/0303152 A1* | 12/2011 | Asari | ............... | H01L 21/67109 |
| | | | | 118/725 |
| 2012/0000414 A1* | 1/2012 | Bondokov | ............... | C30B 23/002 |
| | | | | 117/84 |
| 2013/0269613 A1* | 10/2013 | Sanchez | ............... | H01L 21/02104 |
| | | | | 118/724 |
| 2015/0140211 A1* | 5/2015 | Strobl | ............... | C23C 16/26 |
| | | | | 427/249.6 |

* cited by examiner

VERTICAL FURNACE FOR IMPROVING WAFER UNIFORMITY

BACKGROUND

A vertical furnace, such as a chemical vapor deposition (CVD) process chamber, is used for depositing various films, such as polysilicon, silicon oxide, and silicon nitride films on a large number of semiconductor wafers at one time. To form a thin film with a uniform thickness on many semiconductor wafers at one time in the vertical furnace, a uniform flow of well-mixed precursors (reactive gas) must be produced in a heat treatment tube. However, most of reactive gas inlets of the vertical furnaces are designed near or at a bottom end of the heat treatment tube, and inadequate mixing of precursors occurs in the heat treatment tube, thus resulting in poor uniformity of the thin film formed on the semiconductor wafers.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1A:
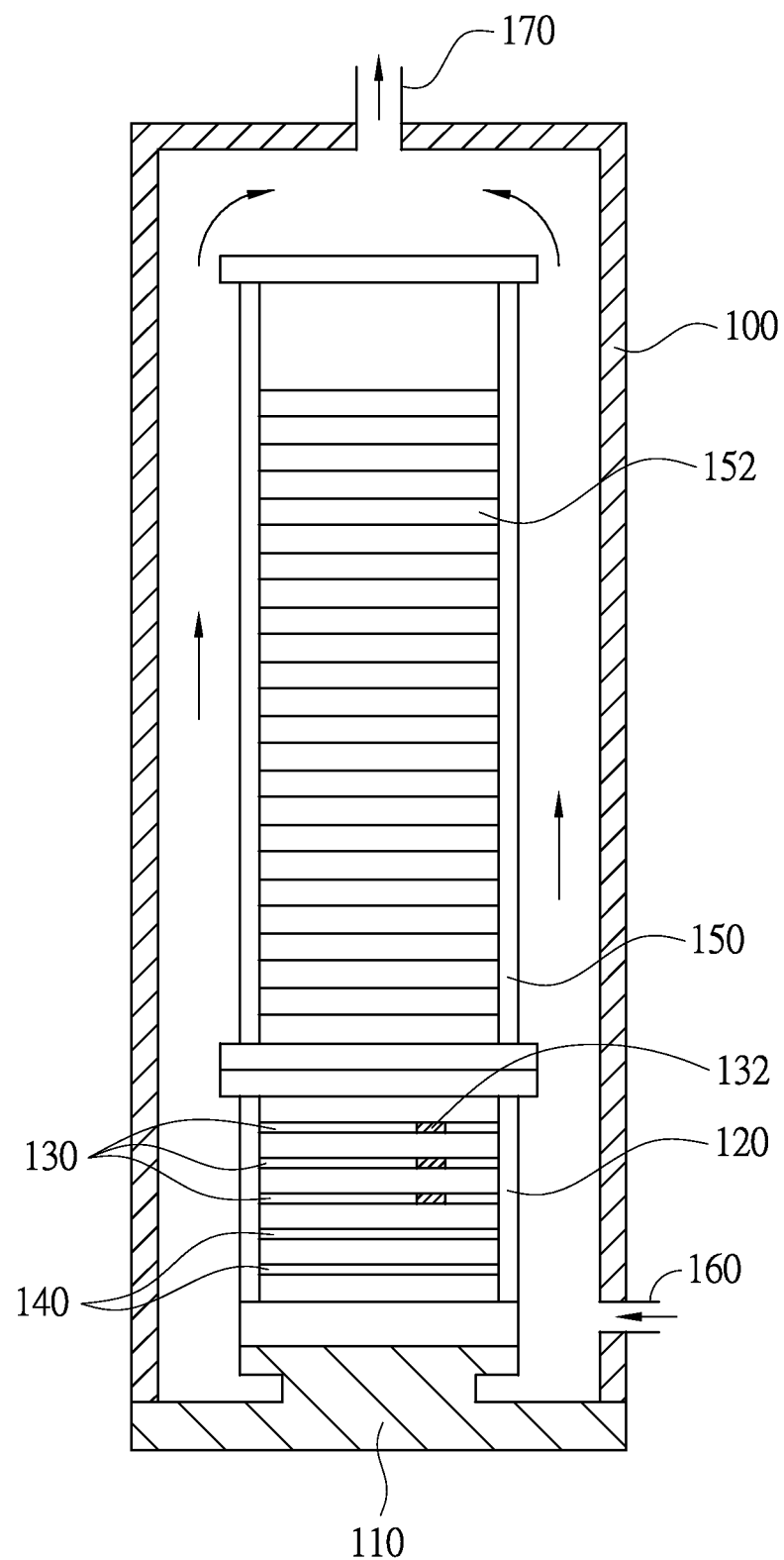
FIG. 1A and FIG. 1B are schematic diagrams showing vertical furnaces for various embodiments.

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Terms used herein are only used to describe the specific embodiments, which are not used to limit the claims appended herewith. For example, unless limited otherwise, the term "one" or "the" of the single form may also represent the plural form. The terms such as "first", "second" and "third" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. Moreover, space orientation terms such as "above", "on", "below, "under" etc. are used to describe a relationship between a device or a characteristic and another device or another characteristic in the drawing. It should be noted that the space orientation term can cover different orientations of the device besides the orientation of the device illustrated in the drawing. For example, if the device in the drawing is turned over, the device located "under" or "below" the other devices or characteristics is reoriented to be located "above" the other devices or characteristics. Therefore, the space orientation term "under" may include two orientations of "above" and "below".

In a typical vertical furnace, reactive gas inlets are disposed at or near a bottom end of a heat treatment tube, and a vertical wafer boat holder in which wafers are stacked is loaded in the heat treatment tube. For example, for depositing silicon nitride on the wafers, two reactive gas inlets are disposed for introducing dichlorosilane ($SiH_2Cl_2$; DCS) and ammonium ($NH_4$) as precursors; and for depositing silicon oxide on the wafers, two reactive gas inlets are disposed for introducing dichlorosilane ($SiH_2Cl_2$; DCS) and nitrous oxide ($N_2O$) as precursors.

Because the reactive gas inlets are concentrated at a side of the heat treatment tube, precursors introduced through the reactive gas inlets are not well mixed around a bottom portion of the wafer boat holder near the side of heat treatment tube. In general, the standard deviations of film thickness of wafers at a bottom portion of the wafer boat holder is larger than the standard deviations of wafers in the central and top portions of the wafer boat holder, because a thicker film is deposited on a portion of the bottom wafers adjacent to the reactive gas inlets. In other words, the wafers at the bottom portions of the wafer boat holder have larger within-wafer-non-uniformities. Therefore, wafers are not loaded in a certain bottom portion of the wafer boat holder intentionally to reduce this wafer to wafer variation. For example, the bottom 25 slots of the wafer boat holder are skipped, and the wafers are loaded from the 26$^{th}$ slot of the wafer boat holder to the top. However, production capacity is wasted.

In the typical vertical furnace, adiabatic plates are disposed below the wafer boat holder in the heat treatment tube. In operation, the wafer boat holder holding the wafers is located at a hot side, for example, toward the top, of the heat treatment tube where a heater is disposed, and the reactive gas inlets are located at a cold side, for example, toward the bottom, of the heat treatment tube. The adiabatic plates are made of a heat-insulating material, such as quartz, silicon carbide (SiC) or the like. The adiabatic plates block heat from the hot side to the cold side. Each adiabatic plate may be a circular disk shape like a wafer. The adiabatic plates are designed to be solid plates. The solid plates disturb reactive gas (precursors) flow, resulting in poor mixing of precursors, and causing non-uniform gas flow. Embodiments of the present disclosure are directed to constructing flow channel structures on some of the adiabatic plates adjacent to the side of the heat treatment tube at which the reactive gas inlets are disposed, such that the precursors can be well mixed and uniform gas flow can be established before entering the wafer boat holder.

Figure 1B:
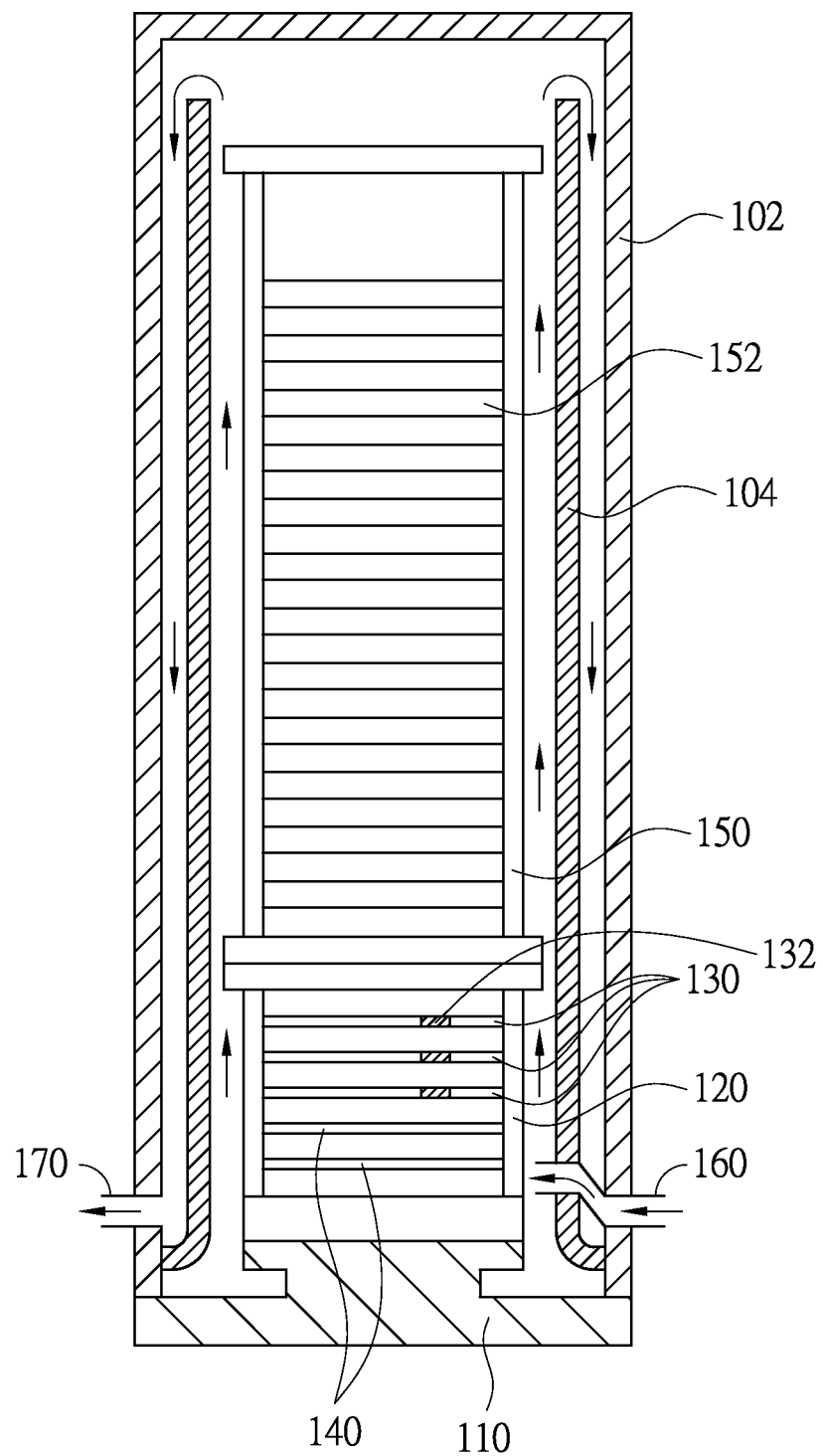
Figure 1C:
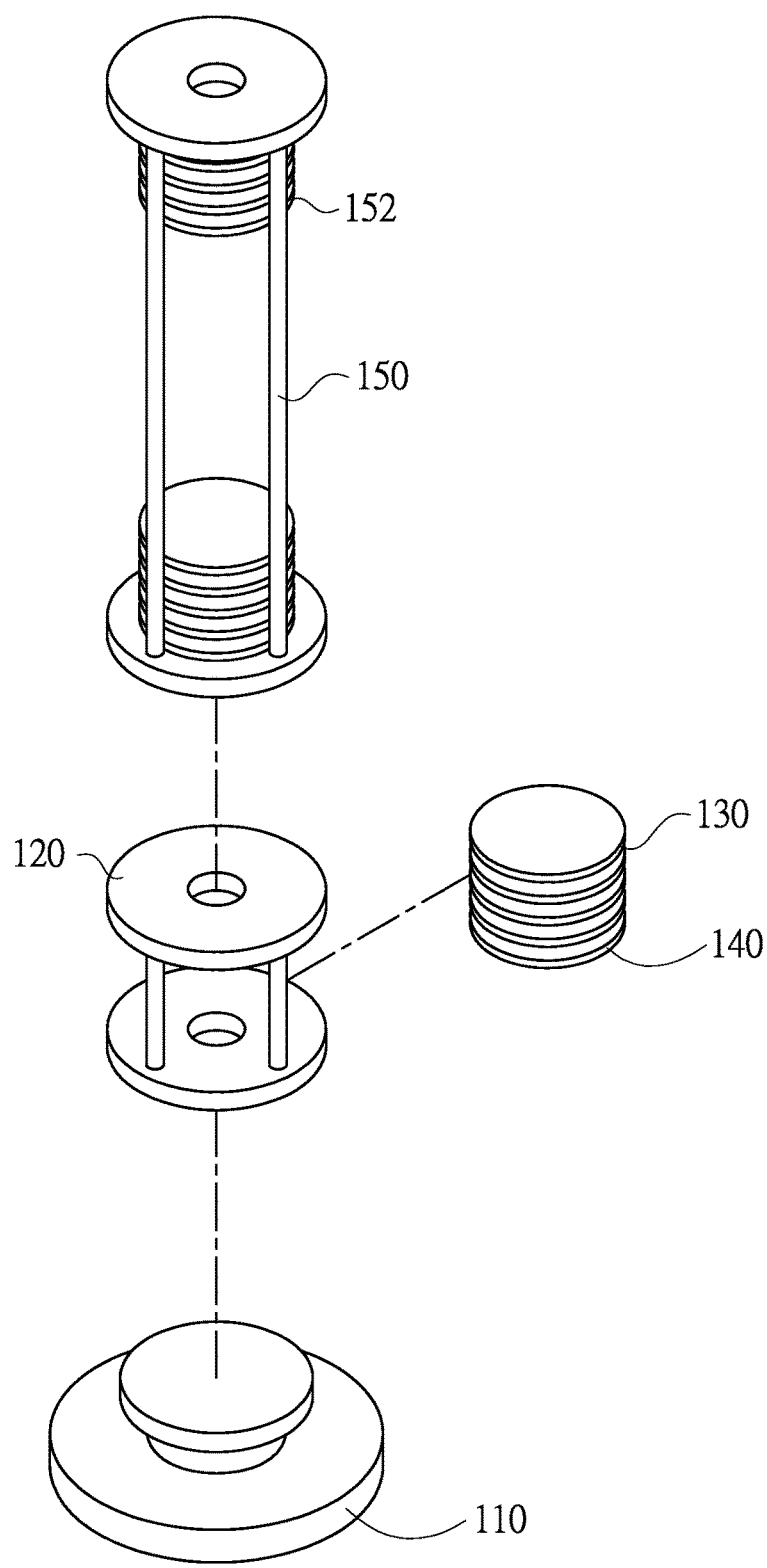
FIG. 1C is a schematic exploded view of main portions in a heat treatment tube depicted in FIG. 1A or FIG. 1B.

FIG. 1A and FIG. 1B are schematic diagrams showing vertical furnaces for various embodiments; and FIG. 1C is a schematic exploded view of main portions in a heat treatment tube depicted in FIG. 1A or FIG. 1B. As shown FIG. 1A, a vertical furnace, such as a CVD process chamber, includes a heat treatment tube 100, at least one reactive gas inlet 160 and a gas exhaust 170. The at least one reactive gas inlet 160 is disposed at a side of the heat treatment tube 100 near or at a bottom end of the heat treatment tube 100, and the gas exhaust 170 is disposed at or near a top end of the heat treatment tube 100. In operation, the vertical furnace further includes a wafer boat holder 150 in which wafers 152 are stacked, first adiabatic plates 130 and second adiabatic plates 140.

In some embodiments, the first adiabatic plates 130 and the second adiabatic plates 140 are stacked in a plate holder 120. The second adiabatic plates 140 are solid adiabatic plates stacked below the first adiabatic plates. Each of the first adiabatic plates 130 has a flow channel structure 132, and all the corners in the flow channel structure 132 are rounded to avoid particle contamination. In some embodiments, optimum results of thickness uniformity on each wafer 152 are obtained when the at least one reactive gas inlet 160 is two or more reactive gas inlets and the two or more reactive gas inlets are uniformly distributed with respect to the flow channel structure 132 in a top view.

In some embodiments, as shown in FIG. 1C, the plate holder 120 with the first and second adiabatic plates 130 and 140 is mounted on a base 110, and a wafer boat holder 150 in which wafers 152 are stacked is disposed on the plate holder 120. The base 110 can be moved in or out of the heat treatment tube 100 together with the plate holder 120 and the wafer boat holder 150 by an elevating unit, for example, a hydraulic jack. In operation, the base 110 together with the plate holder 120 and the wafer boat holder 150 are moved into the heat treatment tube 100. Referring to FIG. 1A, at least one reactive gas enters the heat treatment tube 100 through the at least one reactive gas inlet 160, and enters the wafer boat holder 150 to deposit a film on each wafer 152 after passing through the second adiabatic plates 140, the first adiabatic plates 130 and the flow channel structures 132 in the first adiabatic plates 130. After film deposition, the residual gas is exhausted from the gas exhaust 170. The base 110 together with the plate holder 120 and the wafer boat holder 150 are moved out from the heat treatment tube 100, and then the wafers 152 are transferred to a next processing stage.

For a vertical furnace with only one reactive gas inlet, the flow channel structures 132 of the first adiabatic plates 130 may help to establish a uniform flow pattern through the wafer boat holder 150. For a vertical furnace with two or more reactive gas inlets, the flow channel structures 132 of the first adiabatic plates 130 may help to mix the reactive gases through the respective gas inlets, and to establish a uniform flow pattern in the wafer boat holder 150. By having the flow channel structures 132 on the first adiabatic plates 130, the film thickness deposited on each wafer 152 in the wafer boat holder 150 can be uniform, and every slot in the wafer boat holder 150 can be utilized for receiving a wafer. On the other hand, during film deposition, films are very likely to be deposited on sharp corners in the flow channel structure 132, which will be peeled off later and become a source of particle contamination. Thus, all the corners in the flow channel structure 132 have to be rounded for preventing films from peeling off the flow channel structure 132.

Referring to FIG. 1B, another vertical furnace, such as a CVD process chamber, includes an outer heat treatment tube 102, an inner heat treatment tube 104, first adiabatic plates 130, second adiabatic plates 140, at least one reactive gas inlet 160 and a gas exhaust 170. The at least one reactive gas inlet 160 is disposed at a side of the inner heat treatment tube 104 near or at a bottom end of the inner heat treatment tube 104, and the gas exhaust 170 is disposed at a side of the outer heat treatment tube 102 near or at a bottom end of the outer heat treatment tube 102.

In operation, the base 110 together with the plate holder 120 and the wafer boat holder 150 are moved into the inner heat treatment tube 104 with the first and second adiabatic plates 130 and 140 stacked in the plate holder 120, and with the wafers 152 stacked in the wafer boat holder 150. Then, at least one reactive gas enters the inner heat treatment tube 104 through the at least one reactive gas inlet 160, and enters the wafer boat holder 150 to deposit a film on each wafer 152 after passing through the second adiabatic plates 140, the first adiabatic plates 130 and the flow channel structures 132 in the first adiabatic plates 130. After film deposition, the residual gas enters the space between the outer heat treatment tube 102 and inner heat treatment tube 104 and is exhausted through the gas exhaust 170. The base 110 together with the plate holder 120 and the wafer boat holder 150 are moved out from the inner heat treatment tube 104, and the wafers 152 are transferred to a next processing stage.

As shown in FIG. 1A or FIG. 1B, the first and second adiabatic plates 130 and 140 are used to preserve heat in and around the wafer boat holder 150 in the heat treatment tube as much as possible, such that the heat can be effectively utilized for film deposition. By blocking the heat from the reactive gas inlet 160, unwanted deposition on the surfaces of the heat treatment tube around the reactive gas inlet 160 and on the first and second adiabatic plates is reduced. Though helping to establish a uniform flow pattern to the wafer boat holder 150, the flow channel structures 132 of the first adiabatic plates 130 reduce the heat insulation of the first adiabatic plates 130. A reduced temperature in the hot side may results in a thinner film deposited on the wafers. Thus, the number of the first adiabatic plates 130 and a total surface area of the flow channel structure 132 on each first adiabatic plate 130 is designed so that the film thickness formed on each wafer 152 is sufficient with the same amount of heat input. For obtaining optimum results regarding film thickness and thickness uniformity on each wafer 152, the first adiabatic plates 130 having the flow channel structures 132 are placed near the wafers 152 (the wafer boat holder 150), and a ratio of a total surface area of the flow channel structure to a surface area of each of the first adiabatic plates ranges from about 2% to about 15%. In other words, the first adiabatic plates 130 have to be placed in the topmost portion of a plate holder 120 or in a middle or upper middle portion of the plate holder 120. If the first adiabatic plates 130 are placed at a bottom portion of the plate holder 120, after passing through the first adiabatic plates, the reactive gas flow 130 will be disturbed again by the adiabatic plates stacked above the first adiabatic plates 130.

Figure 2A:
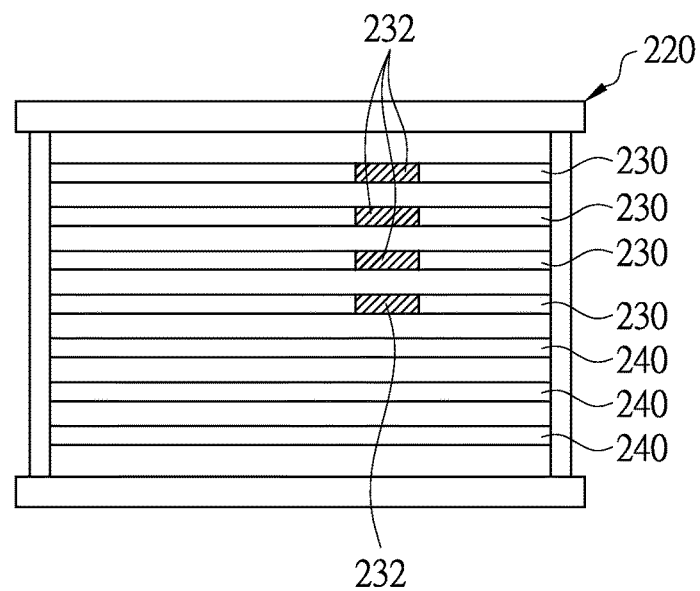
FIG. 2A is a schematic cross-sectional view of an adiabatic plate arrangement in accordance with some embodiments.
Figure 2B:
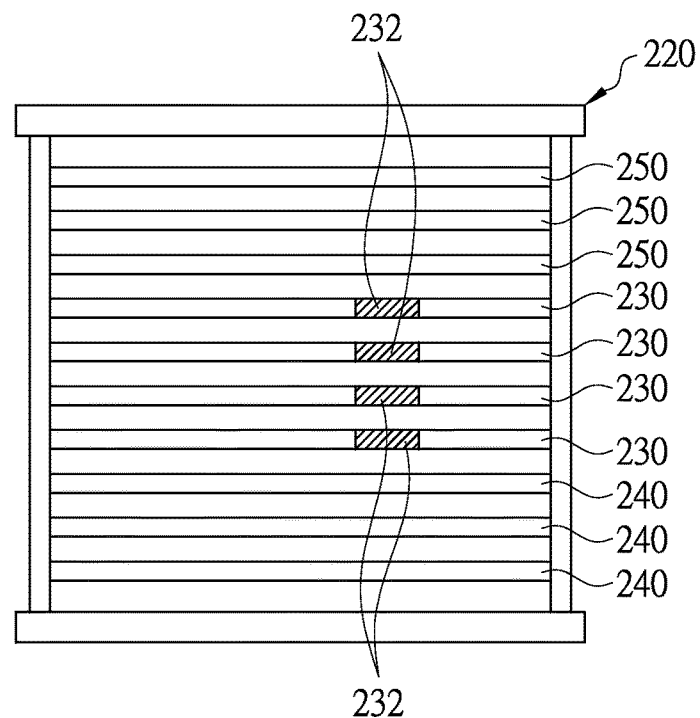
FIG. 2B is a schematic cross-sectional view of an adiabatic plate arrangement in accordance with certain embodiments.

FIG. 2A and FIG. 2B are schematic cross-sectional views of adiabatic plate arrangements for various embodiments. As shown in FIG. 2A, first adiabatic plates 230 with flow channel structures 232 are stacked in the topmost portion of a plate holder 220, and second adiabatic plates 240 are solid adiabatic plates stacked under the first adiabatic plates 230. In some embodiments, a ratio of the number of the first adiabatic plates 230 to the total number of the first and the second adiabatic plates 230 and 240 ranges from about 30% to about 60%. For example, for a vertical furnace with 21 pieces of adiabatic plates (the first and the second adiabatic plates 230 and 240), the number of the first adiabatic plates 230 ranging from 7 to 13 may obtain optimum results regarding film thickness and thickness uniformity on each wafer.

In certain embodiments, as shown in FIG. 2B, third adiabatic plates 250 are solid adiabatic plates stacked in the topmost portion of the plate holder 220, the first adiabatic plates 230 with the flow channel structures 232 are stacked under the third adiabatic plates 250, and the second adiabatic plates 240 are solid adiabatic plates stacked under the first adiabatic plates 230. In other words, the first adiabatic plates 230 with the flow channel structures 232 may also be placed in a middle or upper middle portion of the plate holder 220 to obtain satisfactory film thickness and thickness uniformity on each wafer.

Figure 3A:
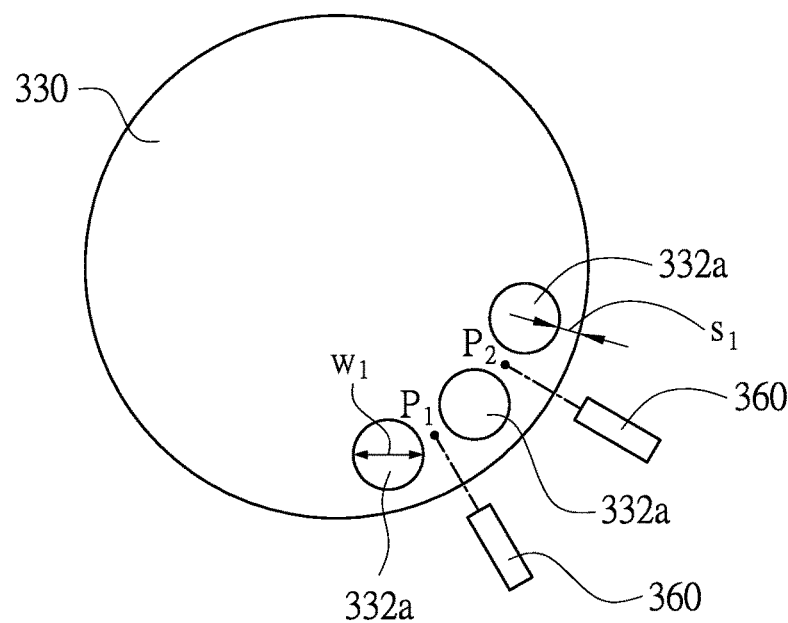
FIG. 3A-FIG. 3D are schematic top views showing exemplary types of first adiabatic plates for various embodiments.

The flow channel structures may be of several types. Examples below are provided for explanation, but embodiments of the present disclosure are not so limited. FIG. 3A-FIG. 3D are schematic top views showing exemplary types of first adiabatic plates in accordance with various embodiments. As shown in FIG. 3A, a first adiabatic plate 330 has three through holes 332a forming a flow channel structure. Two reactive gas inlets 360 are aligned with respective mid points P1 and P2 between every two adjacent through holes 332a, and thus are uniformly distributed with respect to the flow channel structure in a top view. For example, for a 300 mm adiabatic plate, the through holes 332a has a diameter w1 of 30 mm±15%, and a gap s1 between the through hole 332a and an edge of the first adiabatic plate 330 is 10 mm±20%. The through holes 332a has no sharp corners to prevent films from peeling off the edges of the flow channel structure. In other words, the through holes 332a have only rounded corners. The three through holes 332a do not need to be the same size or shape, as long as they are symmetrical about an axis between every two adjacent reactive gas inlets 360.

Figure 3B:
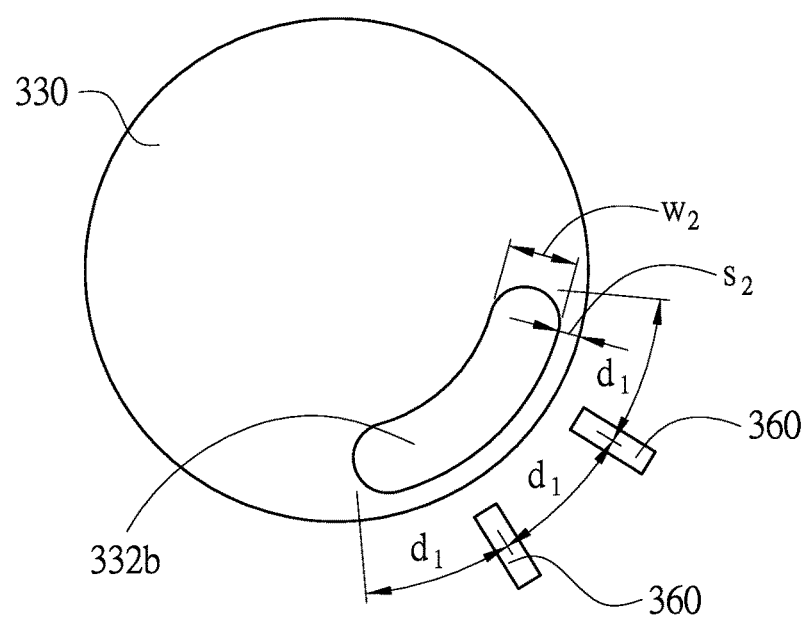

As shown in FIG. 3B, a first adiabatic plate 330 has an elongated opening 332b forming a flow channel structure. The reactive gas inlets 360 are spaced equally having a same radial pitch. In other words, the gas inlets are at the same distance d1 along a concentric curve of the elongated opening 332b, and thus are uniformly distributed with respect to the flow channel structure in a top view. For example, for a 300 mm adiabatic plate, the elongated opening 332b has a width w2 of 30 mm±10%, and a gap s2 between the elongated opening 332b and an edge of the first adiabatic plate 330 is 10 mm±20%. The through holes 332b has no sharp corners to prevent films from peeling off the edges of the flow channel structure. In other words, the through holes 332b have only rounded corners.

Figure 3C:
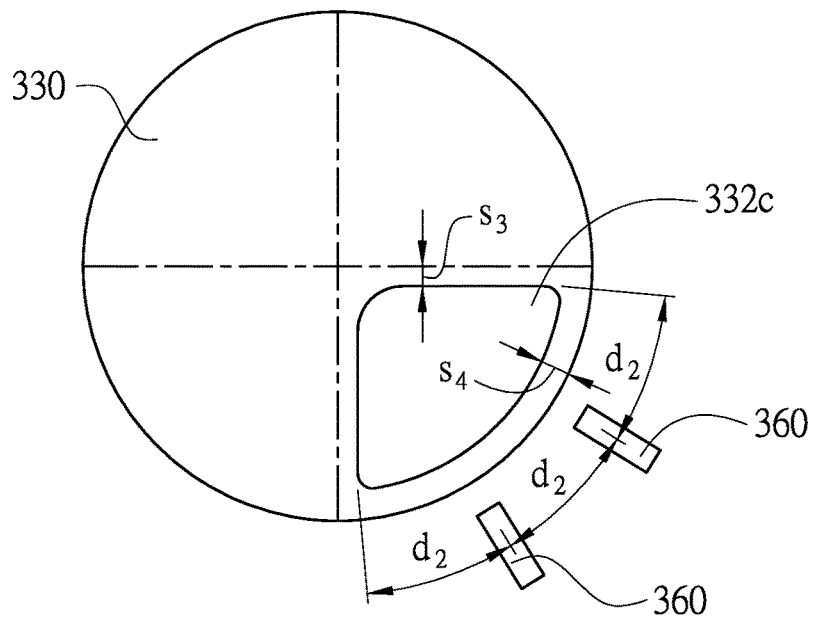

As shown in FIG. 3C, a first adiabatic plate 330 has a quarter circle curve through opening 332c forming a flow channel structure. The reactive gas inlets 360 are spaced equally at the same distance d2 along a concentric curve of the quarter circle curve through opening 332c, and thus are uniformly distributed with respect to the flow channel structure in a top view. For example, for a 300 mm adiabatic plate, a gap s3 between the quarter circle curve through opening 332c and a central line of the first adiabatic plate 330 is 10 mm±20%, and a gap s4 between the quarter circle curve through opening 332c and an edge of the first adiabatic plate 330 is 10 mm±20%. The through holes 332c has no sharp corners to prevent films from peeling off the edges of the flow channel structure. In other words, the through holes 332c have only rounded corners.

Figure 3D:
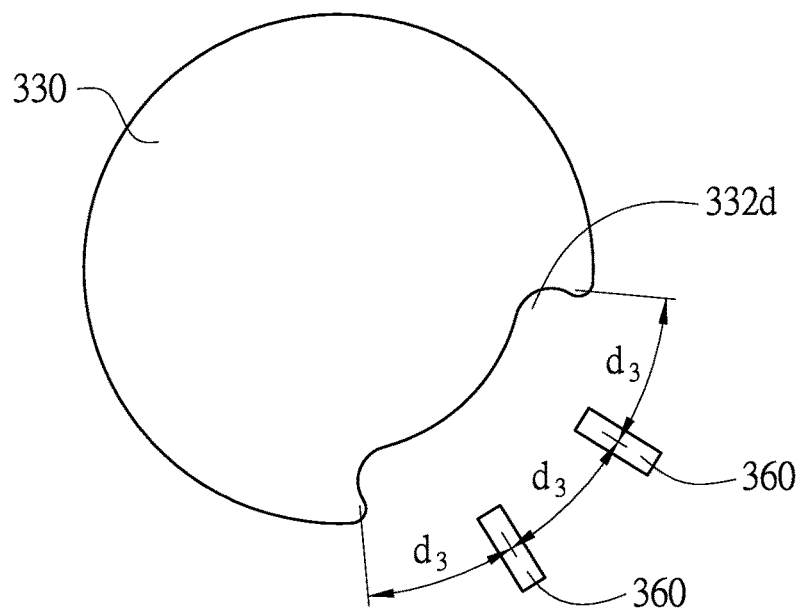

As shown in FIG. 3D, a first adiabatic plate 330 has an elongated groove 332d forming a flow channel structure. The elongated groove 332d is disposed at the edge of a first adiabatic plate 330. The reactive gas inlets 360 are spaced at the same distance d3 along the elongated groove 332d, and thus are uniformly distributed with respect to the flow channel structure in a top view. The through holes 332d has no sharp corners to prevent films from peeling off the edges of the flow channel structure. In other words, the through holes 332d have only rounded corners.

The flow channel structure may through hole, through opening or groove of any shape, as long as the flow channel structure includes no sharp corners, and a ratio of a total surface area of the flow channel structure to a surface area of the first adiabatic plate ranges from about 2% to about 15%.

Figure 4:
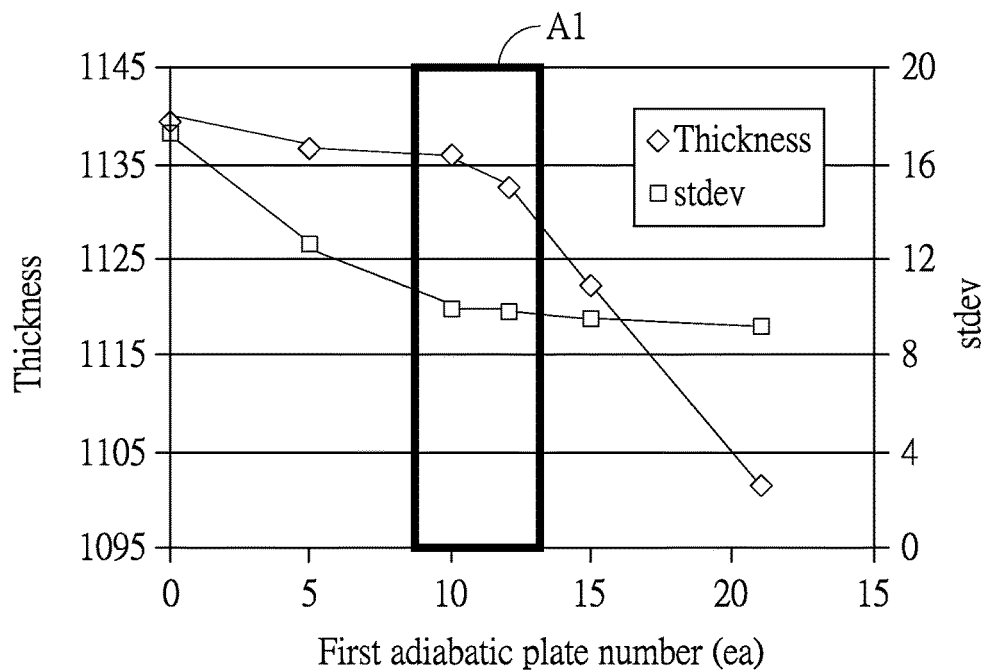
FIG. 4 is an experiment result showing the average film thickness and film thickness standard deviation within each wafer the number of adiabatic plates each of which has a flow channel structure shown in FIG. 3A and FIG. 2A.

FIG. 4 is an experiment result showing the average film thickness and film thickness standard deviation within each wafer versus the number of first adiabatic plates each which has a flow channel structure, when the flow channel structure shown in FIG. 3A and the first adiabatic plates shown in FIG. 2A are used in a vertical furnace with 21 pieces of adiabatic plates. When the number of adiabatic plates having flow channel structures is greater than 13 (i.e. more than 13 pieces of the first adiabatic plates), the average film thickness standard deviation (stdev) within each wafer is about 9 Angstroms and does not change much with the increasing number of the first adiabatic plates, but the average film thickness of each wafer is dramatically decreased from 1130 Angstroms to 1110 Angstroms. As shown in an optimized zone A1 of FIG. 4, when the number of adiabatic plates having flow channel structures ranges from 9 to 12, (i.e. from 9 to 12 pieces of the first adiabatic plates), the average film thickness standard deviation within each wafer is also about 9 Angstroms while the average film thickness still can be maintained to be greater than about 1130 Angstroms. Therefore, when there are 9 to 12 pieces of the first adiabatic plates stacked in the topmost portion of a plate holder in a vertical furnace, a uniform film with sufficient thickness can be formed on all the wafers in a wafer boat holder.

Figure 5:
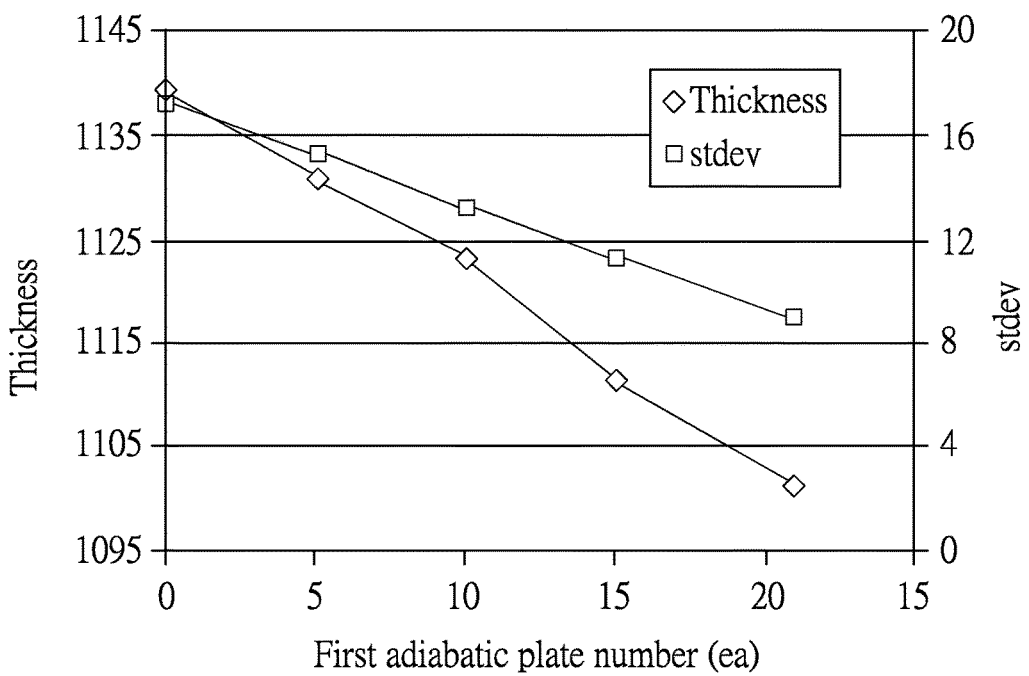
FIG. 5 is an experiment result showing the average film thickness and film thickness standard deviation within each wafer the number of adiabatic plates each of which has a flow channel structure shown in FIG. 3A and FIG. 2B.

FIG. 5 is an experiment result showing the average film thickness and film thickness standard deviation within each wafer versus the number of first adiabatic plates each which has a flow channel structure, when the flow channel structure shown in FIG. 3A and the first and third adiabatic plates shown in FIG. 2B are used in a vertical furnace with 21 pieces of adiabatic plates. When the number of adiabatic plates having flow channel structures is 9 (i.e. 9 pieces of the first adiabatic plates), the average film thickness standard deviation (stdev) within each wafer is about 14 Angstroms, and the average film thickness of each wafer is 1130 Angstroms. When the number of adiabatic plates having flow channel structures is 13 (i.e. 13 pieces of the first adiabatic plates), the average film thickness standard deviation (stdev) within each wafer is about 12 Angstroms, and the average film thickness of each wafer is 1118 Angstroms. Therefore, when there are 9 to 12 pieces of the first adiabatic plates stacked below the third adiabatic plates in a plate holder in a vertical furnace, a uniform film with sufficient thickness can be formed on all the wafers in a wafer boat holder.

In accordance with an embodiment, the present disclosure discloses a vertical furnace including a heat treatment tube, at least one reactive gas inlet, first adiabatic plates and second adiabatic plates. The at least one reactive gas inlet is disposed at or near a bottom end of the heat treatment tube. The first adiabatic plates are stacked in the heat treatment tube, each of the first adiabatic plates having a flow channel structure for allowing a gas to pass through, in which the flow channel structure has no sharp corners. The second adiabatic plates are stacked below the first adiabatic plates in the heat treatment tube.

In accordance with another embodiment, the present disclosure discloses a vertical furnace including a heat treatment tube, at least one reactive gas inlet, first adiabatic plates, at least one second adiabatic plate and at least one third adiabatic plate. The at least one reactive gas inlet is disposed at or near a bottom end of the heat treatment tube. The first adiabatic plates are stacked in the heat treatment tube, each of the first adiabatic plates having a flow channel structure for allowing a gas to pass through, in which the flow channel structure has no sharp corners. The at least one second adiabatic plate is disposed below the first adiabatic plates in the heat treatment tube. The at least one third adiabatic plat is disposed above the first adiabatic plates in the heat treatment tube.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A vertical furnace, comprising:
a heat treatment tube;
a wafer boat holder in the heat treatment tube for holding a plurality of wafers;
at least one reactive gas inlet at or near a first end of the heat treatment tube; and
a plurality of adiabatic plates stacked in the heat treatment tube between the wafer boat holder and the first end of the heat treatment tube, the adiabatic plates consisting of a plurality of first adiabatic plates and a plurality of second adiabatic plates that are solid without any flow channel structure, wherein the first adiabatic plates are stacked between the wafer boat holder and the second adiabatic plates, and the second adiabatic plates are stacked between the first adiabatic plates and the first end of the heat treatment tube, wherein each of the first adiabatic plates has a flow channel structure for allowing a gas to pass through, the flow channel structure has no sharp corners, and in a view from a second end of the heat treatment tube that is opposite the first end of the heat treatment tube, the first end being at or near the at least one reactive gas inlet, the flow channel structure is located at one portion of each of the first adiabatic plates nearer the at least one reactive gas inlet than another portion of each of the first adiabatic plates.

2. The vertical furnace of claim 1, further comprising:
a gas exhaust at or near the second end of the heat treatment tube.

3. The vertical furnace of claim 1, wherein a ratio of the number of the first adiabatic plates to the total number of the first and the second adiabatic plates ranges from 30% to 60%.

4. The vertical furnace of claim 1, wherein a ratio of a total surface area of the flow channel structure to a surface area of each of the first adiabatic plates ranges from 2% to 15%.

5. The vertical furnace of claim 1, wherein the flow channel structure comprises at least three through holes, and the reactive gas inlets are aligned with respective mid points between every two adjacent through holes from the second end of the heat treatment tube when the at least one reactive gas inlet is two or more reactive gas inlets.

6. The vertical furnace of claim 1, wherein the flow channel structure comprises at least one elongated groove at an edge of each of the first adiabatic plates, and the reactive gas inlets are spaced at the same distance along the elongated groove from the second end of the heat treatment tube when the at least one reactive gas inlet is two or more reactive gas inlets.

7. The vertical furnace of claim 1, wherein the at least one reactive gas inlet is two or more reactive gas inlets and wherein the two or more reactive gas inlets are uniformly distributed with respect to the flow channel structure in a view from the second end of the heat treatment tube.

8. The vertical furnace of claim 1, wherein the vertical furnace is a chemical vapor deposition (CVD) process chamber.

9. A vertical furnace, comprising:
a heat treatment tube;
a wafer boat holder in the heat treatment tube for holding a plurality of wafers;
at least one reactive gas inlet at or near a first end of the heat treatment tube; and
a plurality of adiabatic plates stacked in the heat treatment tube between the wafer boat holder and the first end of the heat treatment tube, the plurality of adiabatic plates consisting of a plurality of first adiabatic plates, at least one second adiabatic plate that is solid without any flow channel structure, and at least one third adiabatic plate that is solid without any flow channel structure, wherein the at least one second adiabatic plate is stacked between the plurality of first adiabatic plates and the first end of the heat treatment tube, the at least one third adiabatic plate is stacked between the wafer boat holder and the plurality of first adiabatic plates, and the plurality of first adiabatic plates are stacked between the at least one second adiabatic plate and the at least one third adiabatic plate in the heat treatment tube, wherein each of the first adiabatic plates have a flow channel structure for allowing a gas to pass through, the flow channel structure has no sharp corners, and in a view from a second end of the heat treatment tube that is opposite the first end of the heat treatment tube, the first end being at or near the at least one reactive gas inlet, the flow channel structure is located at one portion of each of the first adiabatic plates nearer the at least one reactive gas inlet than another portion of each of the first adiabatic plates.

10. The vertical furnace of claim 9, further comprising:
a gas exhaust near the first end of the heat treatment tube.

11. The vertical furnace of claim 9, wherein a ratio of the number of the first adiabatic plates to the total number of the first, second and third adiabatic plates ranges from 30% to 60%.

12. The vertical furnace of claim 9, wherein a ratio of a total surface area of the flow channel structure to a surface area of each of the first adiabatic plates ranges from 2% to 15%.

13. The vertical furnace of claim 9, wherein the flow channel structure comprises at least three through holes, and the reactive gas inlets are aligned with respective mid points between every two adjacent through holes from the second end of the heat treatment tube when the at least one reactive gas inlet is two or more reactive gas inlets.

14. The vertical furnace of claim 9, wherein the flow channel structure comprises at least one elongated groove at an edge of each of the first adiabatic plates, and the reactive gas inlets are spaced at the same distance along the elongated groove from the second end of the heat treatment tube when the at least one reactive gas inlet is two or more reactive gas inlets.

15. The vertical furnace of claim 9, wherein the at least one reactive gas inlet is two or more reactive gas inlets and wherein the two or more reactive gas inlets are uniformly distributed with respect to the flow channel structure in a view from the second end of the heat treatment tube.

16. The vertical furnace of claim 9, wherein the vertical furnace is a CVD process chamber.

17. The vertical furnace of claim 1, wherein the flow channel structure comprises at least one elongated opening, and the reactive gas inlets are spaced equally having a same radial pitch from the second end of the heat treatment tube when the at least one reactive gas inlet is two or more reactive gas inlets.

18. The vertical furnace of claim 1, wherein the flow channel structure comprises a quarter circle curve through opening, and the reactive gas inlets are spaced equally at the same distance along a concentric curve of the quarter circle curve through opening when the at least one reactive gas inlet is two or more reactive gas inlets.

* * * * *